United States Patent
Gagne et al.

(10) Patent No.: US 7,924,066 B2
(45) Date of Patent: Apr. 12, 2011

(54) LOW SPEED, LOAD INDEPENDENT, SLEW RATE CONTROLLED OUTPUT BUFFER WITH NO DC POWER CONSUMPTION

(75) Inventors: Nickole A. Gagne, Saco, ME (US); James B. Boomer, Monument, CO (US); Roy L. Yarbrough, Hiram, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 42 days.

(21) Appl. No.: 12/410,848

(22) Filed: Mar. 25, 2009

(65) Prior Publication Data

US 2010/0244907 A1    Sep. 30, 2010

(51) Int. Cl.
*H03K 3/00*    (2006.01)

(52) U.S. Cl. .................................... 327/108
(58) Field of Classification Search ............... None
See application file for complete search history.

(56) References Cited

U.S. PATENT DOCUMENTS

| 5,748,019 A | 5/1998 | Wong et al. |
| 6,606,271 B2* | 8/2003 | Hunt .................. 365/189.05 |
| 2007/0024328 A1* | 2/2007 | Shin ........................ 327/112 |
| 2009/0212828 A1* | 8/2009 | Koji ........................ 327/108 |

* cited by examiner

*Primary Examiner* — Lincoln Donovan
*Assistant Examiner* — Khareem E Almo
(74) *Attorney, Agent, or Firm* — Cesari and McKenna, LLP

(57) ABSTRACT

An output buffer utilizes capacitive feedback to control the output slew rate largely independent of load capacitance. The invention slows the rising and falling slew rates and via a capacitance feedback reduces the effect of load capacitance on slew rate, and uses no DC current. Transistor switches are employed to isolate and reduce noise and interaction among the circuit components and functions.

3 Claims, 4 Drawing Sheets

LOW SPEED, LOAD INDEPENDENT, SLEW RATE CONTROLLED OUTPUT BUFFER WITH NO DC POWER CONSUMPTION

BACKGROUND OF THE INVENTION

1. Field of the Invention

The present invention relates to CMOS output buffers, and more particularly to output buffers with controlled slow slew rates that are relatively independent of capacitive loads and draw no DC power.

2. Background Information

Output buffers must be fast enough to match the high data rates of the signals the buffer is sending, but they must be slow enough to not cause EMI (ElectroMagnetic Interference) with nearby electronics. "Fast enough" and "slow enough" refers to the speed of rising and falling edges. Slew rates," edge "rise and fall times," and other such terms as may be used in the art may have different definitions, but they are used interchangeably herein.

Output load capacitance has a substantial effect of slew rates. With a 20/1 capacitive load variation, prior art slew rates may vary proportionally or even more depending on the equivalent resistance operating with the load capacitance.

FIG. 1 illustrates a prior art output buffer's voltage profiles with 10 pF, 75 pF and 150 pF capacitive loads. So, for example, if a square wave is input, the output edge rise and fall times 10 are about one nanosecond with a 10 pF load capacitor, and those times increase to twenty-four nanoseconds with a 150 pF load capacitor. In this example a 15 to 1 increase in output capacitance results in a 24 to 1 edge slow down.

Limitations of the prior art include one nano-second edge times that may generate EMI noise adversely affecting other electronics, and, with large load capacitors, slow edge rise and fall times may not meet the data rates of the signals involved.

U.S. Pat. No. 5,748,019 ('019) owned by VLSI Technologies, Inc. of San Jose, Calif. compensates for load capacitance. The '019 reference, however, uses reference voltage supplies, current sources and capacitive feedback. But the '019 use voltage references, that constantly drain DC current, and capacitors and current sources that distinguish this reference from the present invention.

It would be advantageous to have an output buffer with an output edge time that remained about constant with capacitive load variations; that was slow enough to not cause EMI disturbances, but was fast enough to meet the data rates of the circuitry involved. For example, an output buffer with an edge rising and falling time of about 20 to 40 nanoseconds when loaded with 10 to 200 pF capacitors, respectively.

SUMMARY OF THE INVENTION

The present invention provides a capacitive feedback circuit that substantially reduces, with respect to prior art, slew rate variations when the capacitive load varies substantially.

Separate RC (Resistor/Capacitor) networks are formed for both positive and negative voltage edges at the output of the buffer. These RC's are arranged to provide a negative feed back to control the slew rates relatively independent of the load capacitors.

Illustratively, the present invention provides for a single inverter input and the charging and discharging of load capacitors and the feedback capacitors through the same output transistor. Current through the feedback capacitor to the gate or control input of the output transistor slows the turn on of the output transistor, reduces the current to the load capacitor thereby slowing the edge rise and fall times of the output voltage. The net effect is to make the slew rate relatively independent of the load capacitors. One way of describing the effect is that the feedback current is dependent upon the load capacitance current. As more load current is delivered, a negative feedback current reduces the rate of increase of load current.

Illustratively, the present invention employs a combination of PMOS and parallel "native NMOS transistors" as the feedback capacitors. This embodiment provides cleaner output rise and fall times. Herein a "native NMOS transistor" refers to a an NMOS transistor that has not undergone channel doping. Such transistors have lower threshold voltages (usually 0 to 3V, or even negative) because it must rely on the intrinsic background or body of the transistor to set the threshold voltage. Because the threshold voltage is lower, a native device provides a better capacitor with a wider voltage range.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
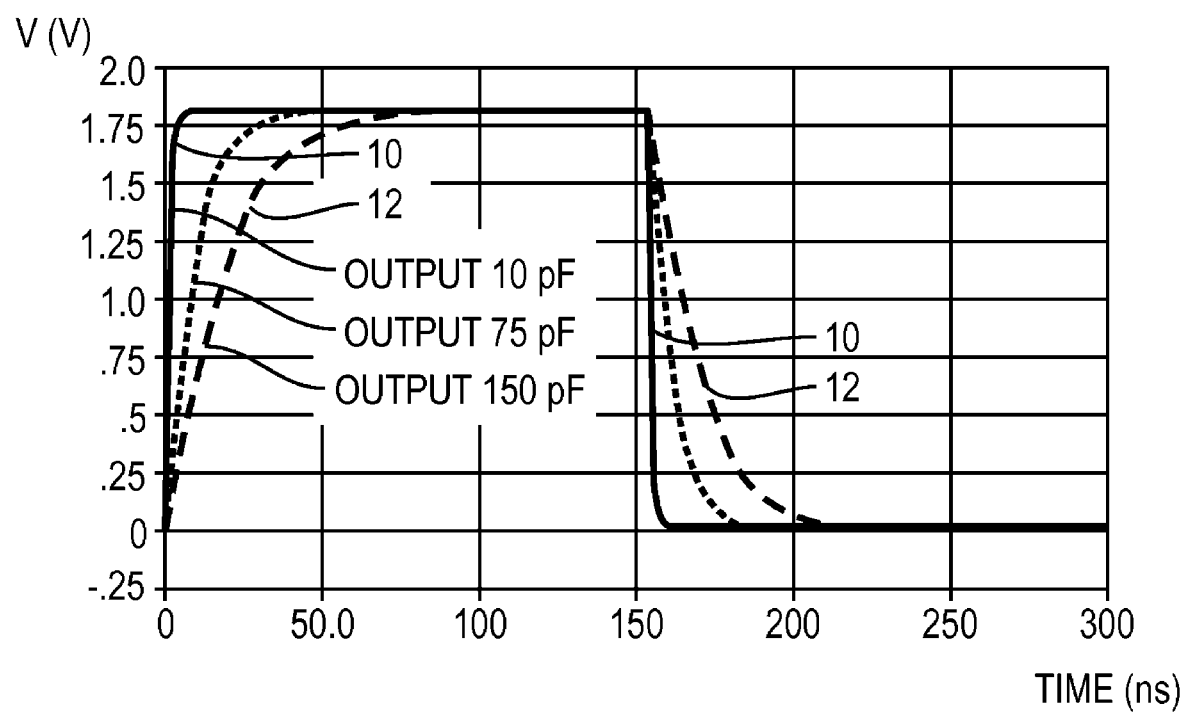
FIG. 1 is a timing diagram of a prior art output buffer response.
Figure 2A:
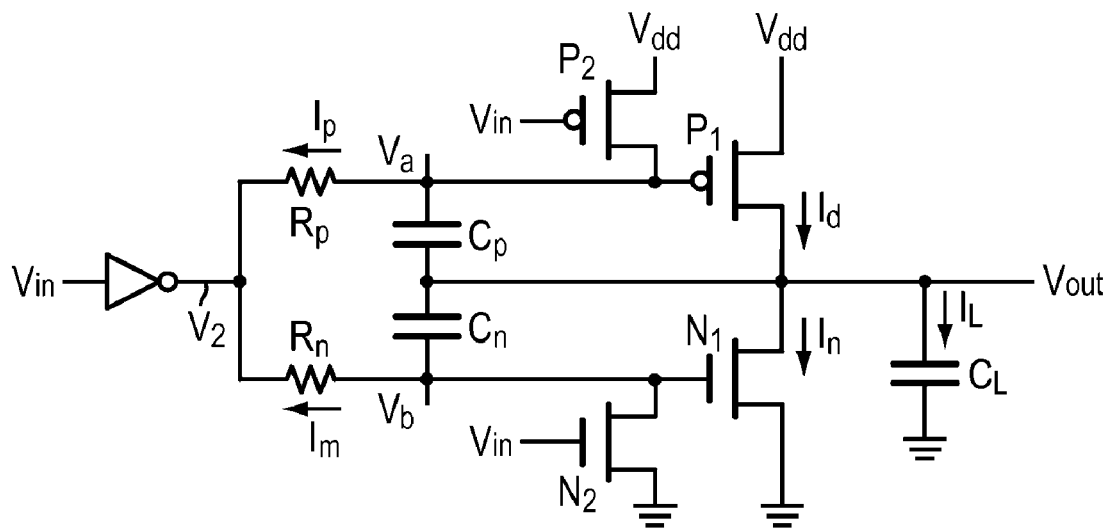
FIG. 2A is a schematic illustrating the feedback character of the present invention.
Figure 2B:
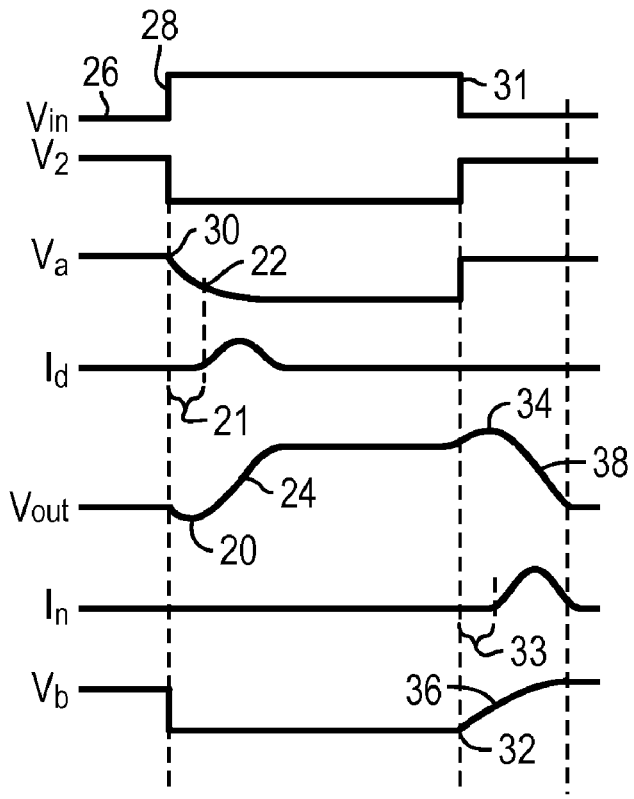
FIG. 2B is a timing chart of signals associated with FIG. 2A.

FIG. 2A is a simplified schematic illustrating a capacitive feedback circuit embodiment of the present invention. FIG. 2B is the associated timing diagram.

With Vin low 26, V2 is high and P2 on driving Va high and keeping P1 off. Vb is high turning on N1 that drives Vout low. When Vin goes high 28, V2 goes low, and N2 turns on, drives Vb low and turns N1 off. Ip rises drawing current from Cp, Cn and Cl, and Va starts to fall 30. Since P1 is not yet on Id is delayed 21, and Vout falls slightly 20 as some of Ip is taken from Cl.

Va falls to a point 22 where P1 starts to turn on supplying Id. Id charges Cl and Vout rises 24. As Vout rises some of Id flows through Cp to Va. This feedback action slows the fall of Va, slows the turn on of P1 and the rise if Id. Note that as Vout rises some of Id is diverted through Cn. Nonetheless, Vout rises more slowly but with more control and less dependence on Cl than in prior art buffers. Using other words, the feedback operation operates as follows, if Cl is larger, with the same Id current, Vout will rise more slowly thereby driving less current through Cp. Va falls more quickly, turning on P1 more quickly and increasing Id to charge Cl more quickly. If Cl is smaller, Cl charges more quickly, Va rises more quickly slowing the turn on of P1 and slowing the rise of Id and the charging of Cl.

When Vin goes back low 31, P1 is turned off via P2 and N2 is turned off allowing N1 to turn on. Vb is low and starts going high 32. As Vb rises it drives current through Cn, Cp and Cl where Vout rises 34 slightly. The turn on of N1 is delayed 33, but at point 36 N1 starts to turn on supplying In to drive Vout low 38. Here the low going Vout draws current from Vb via Cn and slows the rise of Vb and thus the turn on of N1. the operation is similar to that for the rising Vout as described before.

Figures 3A, 3B:
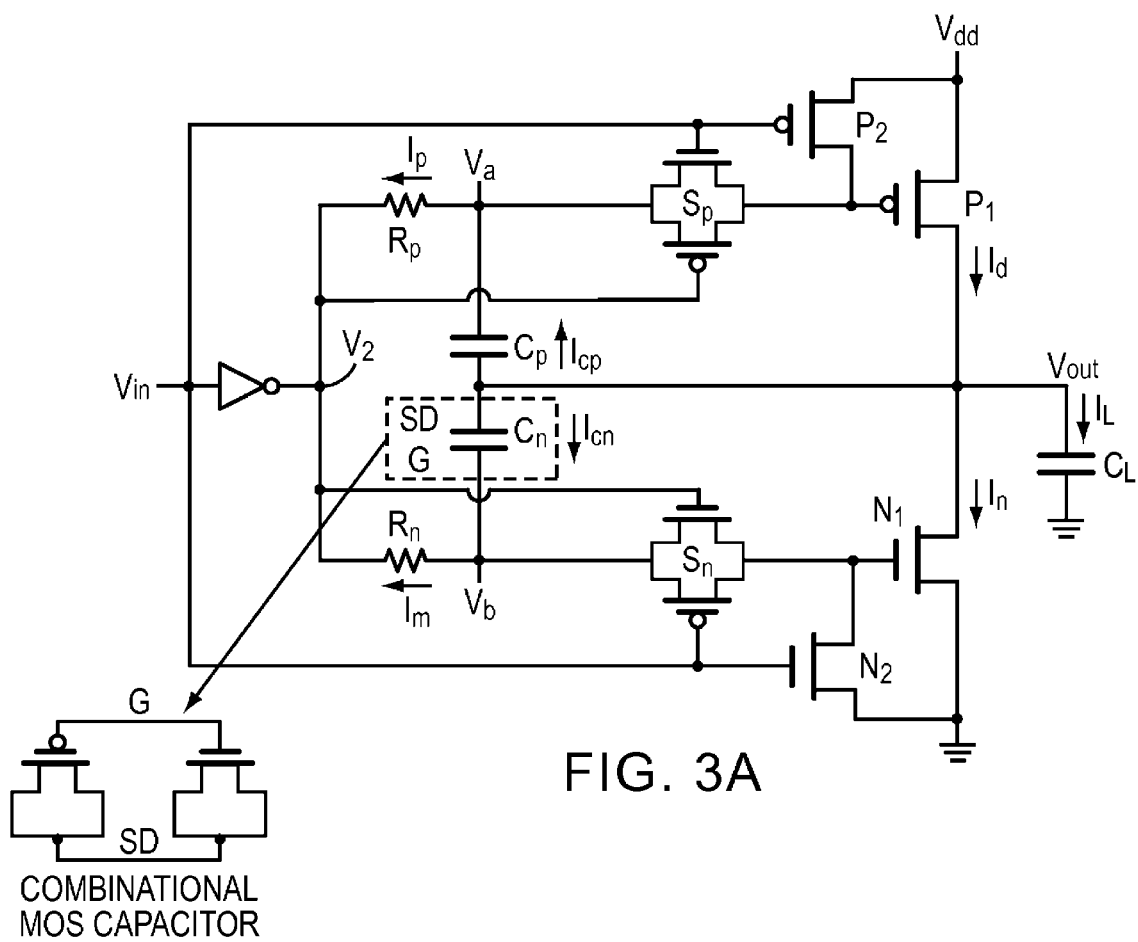
FIG. 3A is a more detailed schematic illustrating the present invention.
FIG. 3B is a schematic of an implementation of the MOS capacitors.

FIG. 3A is a more detailed schematic of the base circuit of FIG. 2A. The additions in FIG. 3A are: the Sp switch that connect Rp to P1 gate when Vin goes high; and the Sn switch that connects Rn to N1 gate when Vin is low. As shown in FIG. 3B, the capacitors Cp and Cn are each formed from a combination of a P and a native N type CMOS transistor.

In other embodiments the Cp and Cn capacitors may be of virtually any structure, e.g. from a capacitor, not formed from a diode or transistor, but from electrodes separated by a dielectric. Other examples of Cp and Cn include: a single or multiple PMOS structures; a single or multiple NMOS structures; any combination of PMOS and non-native NMOS structures; reciprocally connected PMOS and NMOS (NMOS gate to PMOS source/drain, PMOS gate to NMOS source/drain, and other such combination); and even in some embodiments reverse biased bipolar structures.

The output transistors P1 and N1 are isolated by the Sp and Sn switches, and held off by P2 and N2, thereby isolating the output transistors P1 and N1 from each other virtually eliminating any "crowbar" current. Moreover, the circuit draws no DC current since there are no DC current paths.

Figure 4:
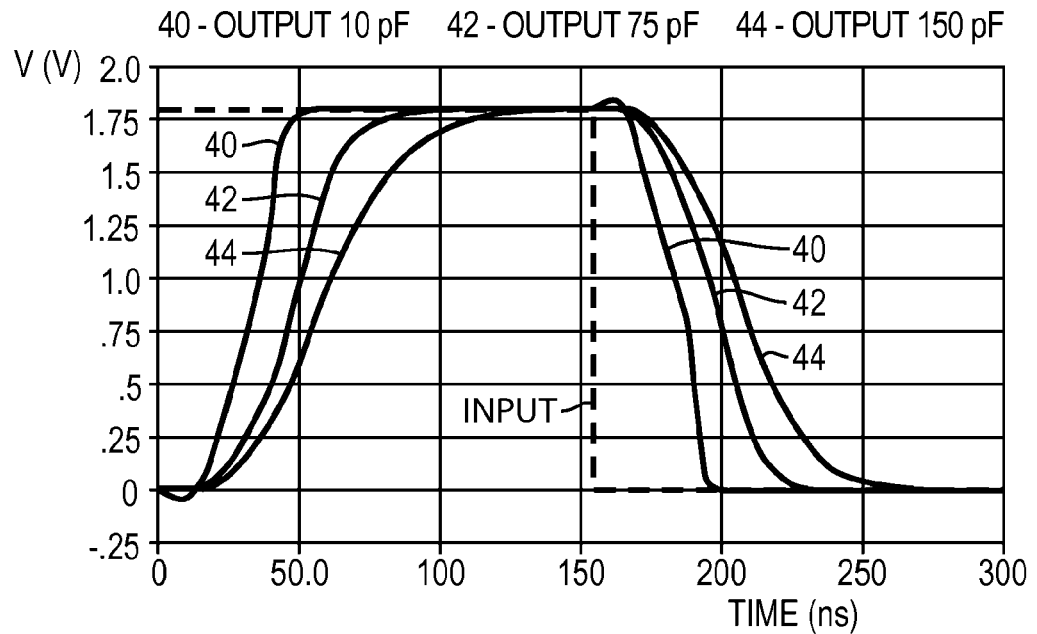
FIG. 4 is a timing diagram of the circuit of FIG. 3A output buffer response.

FIG. 4 shows the output buffer response of the circuit of FIG. 3A, 3B with a square wave voltage input and load capacitors of 10 pF trace 40, 75 pF, trace 42, and 150 pF, trace 44. The corresponding rise times are 17 nanoseconds for trace 40 to 37 nanoseconds for trace 44.

Figure 5:
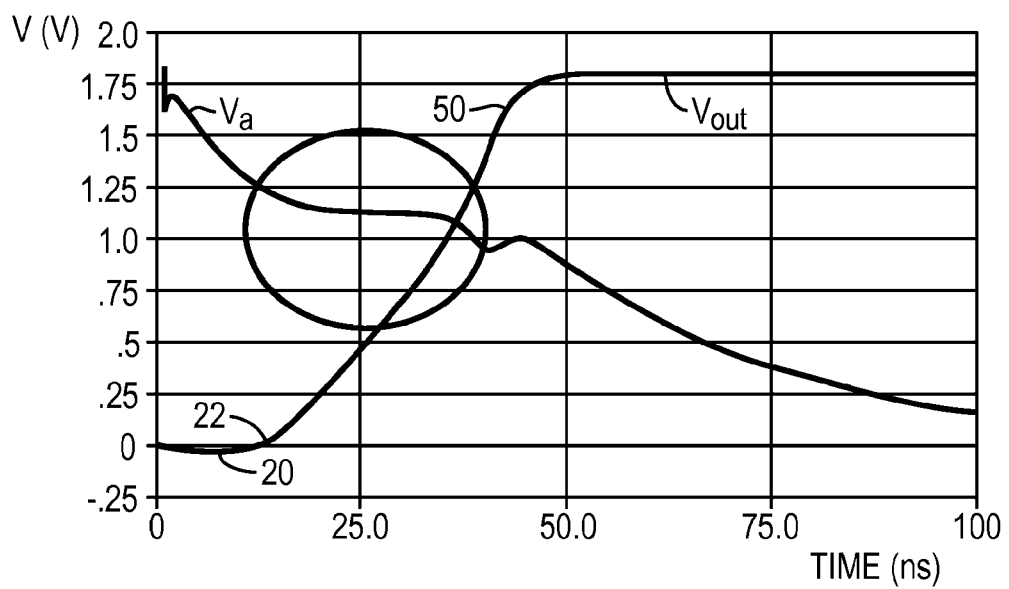
FIG. 5 is a timing chart illustrating a transition area of the circuit of FIG. 3A.

FIG. 5 illustrates a rising edge of the Vout and the falling edge Va (at the gate of P1) as P1 turns on at 22 producing current Id. Note the dip in Vout 20 where P2 is not yet on, and current is first drawn via Cp from Cl. The circled part is where Il about equals Icp.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An output buffer, comprising:
   an inverter connected to provide an output in response to receiving a buffer input;
   a pull up output transistor having a drain connected to provide a buffer output;
   a first resistor connected between the inverter output and the gate of the pull up transistor;
   a first feedback capacitor connected between the gate of the pull up transistor and the buffer output;
   a pull down output transistor having a drain connected to the buffer output;
   a second resistor connected between the inverter output and the gate of the pull up transistor;
   a second feedback capacitor connected between the gate of the pull down transistor and the buffer output;
   a third transistor having a source connectable to a power supply, a gate connected to the input signal, and a drain connected to the gate of the pull up transistor, and
   a fourth transistor having a source connectable to a ground, a gate connected to the input signal, and a drain connected to the gate of the pull down transistor,
   wherein current is driven through the first capacitor to slow the rise of the output voltage in response to the buffer input going high and current is driven through the second capacitor to slow the fall of the output voltage in response to the buffer input going low.

2. The output buffer of claim 1 further comprising a first switch connected between the gate of the pull up output transistor and one end of the feedback capacitor, wherein the first switch is turned on when the inverter output goes low and is turned off when the inverter output goes high, and a second switch connected between the gate of the pull down output transistor and one end of the second feedback capacitor, wherein the switch is turned on when the inverter output goes high and is turned off when the inverter output goes low.

3. The output buffer of claim 2 wherein the feedback capacitor and the second feedback capacitor both comprise combinational PMOS and a parallel NMOS transistors.

* * * * *